(12) United States Patent
Huang et al.

(10) Patent No.: US 8,383,955 B2
(45) Date of Patent: Feb. 26, 2013

(54) PRINTED CIRCUIT BOARD

(75) Inventors: Tsung-Sheng Huang, Tu-Cheng (TW);
Chun-Jen Chen, Tu-Cheng (TW);
Duen-Yi Ho, Tu-Cheng (TW);
Wei-Chieh Chou, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 182 days.

(21) Appl. No.: 13/097,104

(22) Filed: Apr. 29, 2011

(65) Prior Publication Data
US 2012/0241207 A1  Sep. 27, 2012

(30) Foreign Application Priority Data
Mar. 24, 2011  (TW) ............................. 10110065 A

(51) Int. Cl.
*H05K 1/11*  (2006.01)
(52) U.S. Cl. ........ 174/262; 174/260; 174/261; 361/760; 361/792; 361/793; 361/794; 361/795

(58) Field of Classification Search .................. 174/260, 174/261, 262; 361/760, 792, 793, 794, 795
See application file for complete search history.

(56) References Cited

U.S. PATENT DOCUMENTS

| | | | | |
|---|---|---|---|---|
| 6,080,335 | A * | 6/2000 | Ohshita et al. | 252/500 |
| 2007/0124930 | A1* | 6/2007 | Cheng et al. | 29/852 |
| 2008/0093112 | A1* | 4/2008 | Kushta | 174/260 |

* cited by examiner

*Primary Examiner* — Timothy Thompson
*Assistant Examiner* — Pete Lee
(74) *Attorney, Agent, or Firm* — Altis Law Group, Inc.

(57) ABSTRACT

A printed circuit board (PCB) includes first to fourth layers. A power supply is arranged on the first layer. An electronic component is arranged on the fourth layer. A first via and a second via extend through the PCB and are electrically connected to the electronic component. The PCB further includes third to seventh vias. A length of a transmission path of the current flows from the power supply to electronic component through the third via and the seventh via is almost the same as a length of a transmission path of the current flows from the power supply to the electronic component through the fourth to sixth vias.

6 Claims, 3 Drawing Sheets

PRINTED CIRCUIT BOARD

BACKGROUND

1. Technical Field

The present disclosure relates to a printed circuit board (PCB).

2. Description of Related Art

Referring to FIG. 3, a conventional PCB is shown. The PCB includes first to fourth layers, and dielectric materials 1 respectively sandwiched between every two adjacent layers. The layers comprise conductive copper pathways that remain after etching copper foils and the conductive copper pathways are called transmission lines or traces. The dielectric material 1 insulates two adjacent etched copper layers from each other. A power supply 5 and a trace 6 are arranged on the first layer. A trace 7 is arranged in the third layer. An electronic component 8 is arranged on the fourth layer. Four vertical interconnection accesses (vias) 2a, 2b, 3a, and 3b extend through the PCB. The vias 2a and 2b are close to the power supply 5. The vias 3a and 3b are arranged on a side of the via 2a away from the power supply 5. The trace 6 is electrically connected to the power supply 5, and the vias 2a, 2b, 3a, and 3b. The trace 7 is electrically connected to the vias 2a, 2b, 3a, and 3b.

As arrows show in FIG. 3, when the power supply 5 supplies power to the electronic component 8, a first part of the current flows to the electronic component 8 through the trace 6, and the vias 3a and 3b, and a second part of the current flows to the electronic component 8 through the vias 2a, 2b, and the trace 7.

According to PCB manufacturing procedures, impedance of the traces arranged on the top layer (the first layer of the PCB) or the bottom layer (the fourth layer of the PCB) is greater than impedance of the traces arranged on an inner layer (the second layer or the third layer of the PCB). As a result, the impedance of a transmission path for the part of the current flowing through the vias 2a and 3a is least. Because the current flows to the electronic component 8 through a path with the least resistance, the current passing through the via 2a is too high, as indicate in the following table 1:

TABLE 1

|  | Via | |
| --- | --- | --- |
|  | Via 2b | Via 2a |
| Current/(Ampere) | 1.258 | 4.390 |

The resulting high temperature created may make the PCB unstable or may even damage the PCB.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
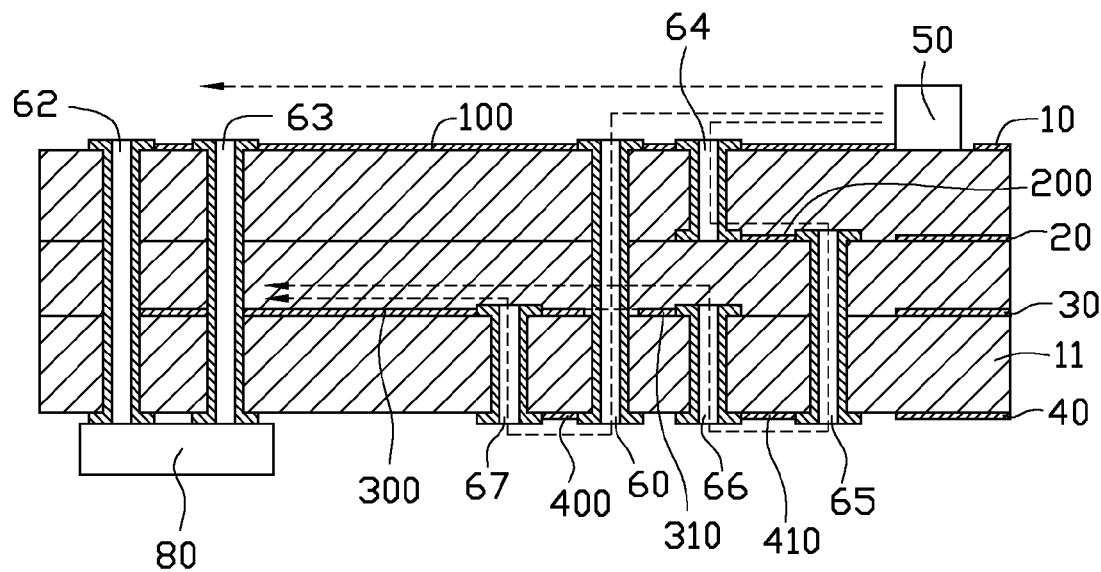
FIG. 1 is a sectional view of a first embodiment of a printed circuit board.

Referring to FIG. 1, an exemplary embodiment of a printed circuit board (PCB) includes first to fourth layers 10, 20, 30, and 40. Dielectric materials 11 respectively sandwiched between adjacent first to fourth layers 10, 20, 30, and 40. The layers include conductive copper pathways that remain after etching copper foils and the conductive copper pathways are called transmission lines or traces. The dielectric material 11 insulates two adjacent etched copper layers from each other.

A power supply 50 and a trace 100 electrically connected to the power supply 50 are arranged on the first layer 10. An electronic component 80 is arranged on the fourth layer 40. A via 60 extends through the first to fourth layers 10, 20, 30, and 40, and is electrically connected to the first layer 10 and the fourth layer 40. The via 60 is insulated from the second layer 20 and the third layer 30. The via 60 is further electrically connected to the trace 100.

Two vias 62 and 63 extend through the first to fourth layers 10, 20, 30, and 40, and are electrically connected to the electronic component 80 arranged on the fourth layer 40. The trace 100 is electrically connected to the vias 62 and 63.

A via 64 extends through the first layer 10 and the second layer 20. The via 64 is electrically connected to the trace 100. A via 65 extends through the second layer 20, the third layer 30, and the fourth layer 40, and is insulated from the third layer 30. Two vias 66 and 67 extend through the third layer 30 and the fourth layer 40.

A trace 200 is arranged on the second layer 20, and electrically connects the vias 64 and 65 together. Two traces 300 and 310 are arranged on the third layer 30. The trace 300 is electrically connected to the vias 67, 62, and 63. The trace 310 electrically connects the trace 300 and the via 66 together. Two traces 400 and 410 are arranged on the fourth layer 40. The trace 400 electrically connects the vias 60 and 67 together. The trace 410 electrically connects the vias 65 and 66 together.

In the embodiment, the via 60 is close to the power supply 50. The via 64 is arranged between the via 60 and the power supply 50. The via 66 is arranged below the via 64. The via 65 is arranged between the via 64 and the power supply 50. The via 67 is arranged at a side of the via 60 away from the power supply 50. The vias 62 and 63 are arranged on a side of the via 67 away from the via 60.

Following the arrows shown in FIG. 1, when the power supply 50 supplies power to the electronic component 80, a first part of the current of the power supply 50 flows to the electronic component 80 through the trace 100, and the vias 62 and 63. A second part of the current of the power supply 50 flows to the electronic component 80 through the via 60, the trace 400, the via 67, and the trace 300 in that order. A third part of the current of the power supply 50 flows to the electronic component 80 through the via 64, the trace 200, the via 65, the trace 410, the via 66, and the traces 310 and 300 in that order.

According to manufacture procedure of the PCB, impedance of the traces arranged on the top layer (the first layer 10 in the embodiment) or the bottom layer (the fourth layer 40 in the embodiment) is greater than impedance of the traces arranged on the inner layer (the second layer 20 or the third layer 30 in the embodiment). As a result, a difference between the impedance of a transmission path for the second part of the current and the impedance of a transmission path for the third part of the current of the power supply 50 is decreased. As a result, the currents passing through the two transmission paths are almost the same, thus avoiding too much of an imbalance in current through the vias.

Referring to Table 2, current values through the vias 60 and 64 in FIG. 1 are shown.

TABLE 2

|  | Via | |
| --- | --- | --- |
|  | Via 60 | Via 64 |
| Current/(Ampere) | 1.838 | 3.110 |

As shown in Table 2, a difference between current values through the vias 64 and 60 in FIG. 1 is decreased when compared with table 1.

Figure 2:
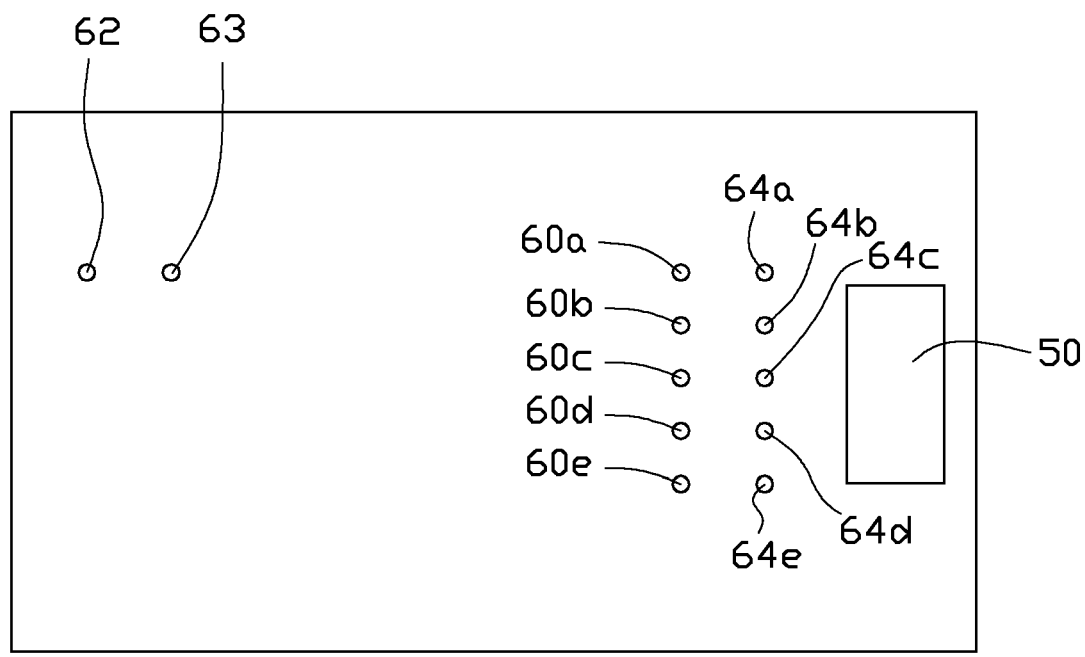
FIG. 2 is a top plan view of a second embodiment of a printed circuit board.
Figure 3:
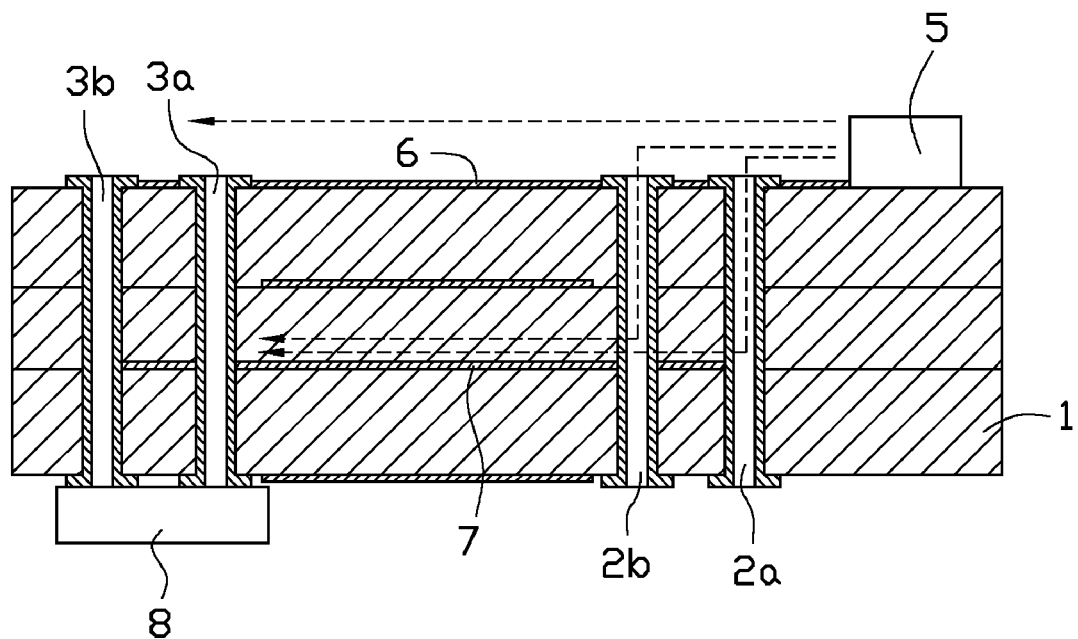
FIG. 3 is a sectional view of a conventional printed circuit board.

Referring to FIG. 2, in another exemplary embodiment of a PCB, a first row of vias replace the via 60 in FIG. 1, a second row of vias replace the via 64, a third row of vias replace the via 65, a fourth row of vias replace the via 66, and a fifth row of vias replace the via 67. In the embodiment, the first row of vias include five vias 60a-60e as shown in FIG. 2. The second row of vias include five vias 64a-64e, the third row of vias include five vias, the fourth row of vias include five vias, and the fifth row of vias include five vias. Five vias in each row of vias are arranged as the five vias 60a-60e. In other embodiments, a distance between the via 60a and the power supply 50 equals to a distance between the via 60b and the power supply 50. A distance between the via 64a and the power supply 50 equals to a distance between the via 64b and the power supply 50. As a result, the difference between the current flows each via is decreased.

Each of the first row of vias 60a-60e extends through the first to fourth layers 10, 20, 30, and 40, and are electrically connected to the first layer 10 and the fourth layer 40. Each of the second row of vias 64a-64e extends through the first layer 10 and the second layer 20. Each of the third row of vias extends through the second layer 20, the third layer 30, and the fourth layer 40, and is insulated from the third layer 30. Each of the fourth and fifth rows of vias extends through the third layer 30 and the fourth layer 40.

A first row of traces electrically connect the power supply 50 and the first row of vias 60a-60e, and the second row of vias 64a-64e. In other words, a first trace in the first row of traces is connected to the power supply 50, the vias 60a, 64a, 62, and 63. A second trace in the first row of traces is connected to the power supply 50, the vias 60b, 64b, 62, and 63. A third trace in the first row of traces is connected to the power supply 50, the vias 60c, 64c, 62, and 63. A fourth trace in the first row of traces is connected to the power supply 50, the vias 60d, 64d, 62, and 63. A fifth trace in the row of traces is connected to the power supply 50, the vias 60e, 64e, 62, and 63. A second row of traces electrically connect the second row of vias 64a-64e and the third row of vias respectively. A third row of traces are electrically connected to the fourth and fifth rows of vias respectively, and the vias 62 and 63. A fourth row of traces are electrically connected to the fourth row of vias and the third row of traces respectively. A fifth row of traces electrically connect the first row of vias 60a-60e and the fifth row of vias respectively. A sixth row of traces electrically connect the third row of vias and the fourth row of vias respectively.

The foregoing description of the exemplary embodiments of the disclosure has been presented only for the purposes of illustration and description and is not intended to be exhaustive or to limit the disclosure to the precise forms disclosed. Many modifications and variations are possible in light of the above everything. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. A printed circuit board comprising first to fourth layers, wherein a power supply is arranged on the first layer, an electronic component is arranged on the fourth layer, a first vertical interconnection access (via) and a second via extend through the first to fourth layers, and are electrically connected to the electronic component, the power supply is electrically connected to the first and second vias through a first trace arranged on the first layer, a third via extends through the first to fourth layers, and is insulated from the second and third layers, a fourth via extends through the first layer and the second layer, a fifth via extends through the second to fourth layers, and is insulated from the third layer, a sixth via and a seventh via extend through the third layer and the fourth layer, a second trace arranged on the second layer is electrically connected to the fourth via and the fifth via, a third trace arranged on the fourth layer is electrically connected to the fifth via and the sixth via, a fourth trace arranged on the third layer is electrically connected to the first via, the second via, and the seventh via, a fifth trace arranged on the third layer is electrically connected to the sixth via and the fourth trace, a sixth trace arranged on the fourth layer is electrically connected to the third via and the seventh via.

2. The printed circuit board of claim 1, wherein the third via is arranged between the first via and the power supply, the second via is arranged at a side of the first via away from the third via, the fourth via is arranged between the third via and the power supply, the fifth via is arranged between the fourth via and the power supply, the sixth via is arranged below the fourth via, the seventh via is arranged between the first via and the third via.

3. A printed circuit board comprising first to fourth layers, wherein a power supply is arranged on the first layer, an electronic component is arranged on the fourth layer, a first row of vias, a first via, and a second via extend through the first to fourth layers, and are electrically connected to the electronic component, a second row of vias extend through the first and second layers, the power supply is electrically connected to the first row of vias, the second row of vias, and the first and second vias through a first row of traces arranged on the first layer, a third row of vias extend through the second to fourth layers, and are insulated from the third layer, a fourth row of vias and a fifth row of vias extend through the third layer and the fourth layer, each of a second row of traces arranged on the second layer electrically connects a corresponding via of the second row of vias and a corresponding via of the third row of vias, each of a third row of traces arranged on the third layer is electrically connected to a corresponding via in the fourth rows of vias, a corresponding via in the fifth row of vias, and the first and second vias, each of a fourth row of traces electrically connects a via of the fourth row of vias and a corresponding trace of the third row of traces, each of a fifth row of traces electrically connects a via of the first row of vias and a corresponding via of the fifth row of vias, each of a sixth row of traces electrically connects a via of the third row of vias and a corresponding via of the fourth row of vias.

4. The printed circuit board of claim 3, wherein the second row of vias are arranged between the first row of vias and the power supply, the first and second vias are arranged at a side of the first row of vias away from the second row of vias, the third row of vias are arranged between the second row of vias and the power supply, each of the fourth row of vias is arranged below a corresponding via of the second row of vias, the fifth row of vias are arranged between the first row of vias and the first via.

5. The printed circuit board of claim 3, wherein each of the first to fifth rows of vias comprise at least two vias.

6. The printed circuit board of claim 3, wherein a distance between a via in each row of the first to fifth rows of vias and the power supply equals to a distance between another via in the corresponding row and the power supply.

* * * * *

UNITED STATES PATENT AND TRADEMARK OFFICE
CERTIFICATE OF CORRECTION

PATENT NO. : 8,383,955 B2  
APPLICATION NO. : 13/097104  
DATED : February 26, 2013  
INVENTOR(S) : Tsung-Sheng Huang et al.

Page 1 of 1

It is certified that error appears in the above-identified patent and that said Letters Patent is hereby corrected as shown below:

On the title page please replace Item (30) regarding "Foreign Application Priority Data" with the following:

(30) Foreign Application Priority Data

Mar. 24, 2011  (TW) .............................. 100110065

Signed and Sealed this  
Twenty-sixth Day of November, 2013

Margaret A. Focarino  
*Commissioner for Patents of the United States Patent and Trademark Office*